US009237630B2

(12) United States Patent
Wakahara et al.

(10) Patent No.: US 9,237,630 B2
(45) Date of Patent: Jan. 12, 2016

(54) PLANAR LIGHT EMITTING DEVICE AND FRONT FILM

(71) Applicant: Toray Industries, Inc., Tokyo (JP)

(72) Inventors: Ryuichi Wakahara, Otsu (JP);
Motoyuki Suzuki, Otsu (JP); Yuji Kawata, Otsu (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 14/360,728

(22) PCT Filed: Dec. 5, 2012

(86) PCT No.: PCT/JP2012/081451
§ 371 (c)(1),
(2) Date: May 27, 2014

(87) PCT Pub. No.: WO2013/088997
PCT Pub. Date: Jun. 20, 2013

(65) Prior Publication Data
US 2014/0320000 A1      Oct. 30, 2014

(30) Foreign Application Priority Data

Dec. 15, 2011   (JP) .................................. 2011-274130

(51) Int. Cl.
*H05B 33/12* (2006.01)
*H05B 33/02* (2006.01)
(Continued)

(52) U.S. Cl.
CPC ............. *H05B 33/12* (2013.01); *G02B 5/0226* (2013.01); *G02B 5/0242* (2013.01); *G02B 5/0278* (2013.01); *H01L 51/5268* (2013.01); *H01L 51/5284* (2013.01); *H05B 33/02* (2013.01)

(58) Field of Classification Search
CPC ................... H05K 1/0366; H05K 2201/0209; G02B 5/22; G02B 5/223; H01J 2211/44
USPC ........................ 313/504, 511, 507; 445/24, 25
See application file for complete search history.

(56) References Cited

U.S. PATENT DOCUMENTS

2006/0021267 A1*   2/2006   Matsuda et al. ................ 40/546
2007/0190317 A1*   8/2007   Motoda et al. ................ 428/343
(Continued)

FOREIGN PATENT DOCUMENTS

JP      2003-109747     4/2003
JP      2010-033780     2/2010
(Continued)

OTHER PUBLICATIONS

Obara et al., Japanese Patent Application 2010-033780, Feb. 2010, machine translation.*
(Continued)

*Primary Examiner* — Tracie Y Green
(74) *Attorney, Agent, or Firm* — DLA Piper LLP (US)

(57) ABSTRACT

A planar light emitting device includes a light-emitting element having a light-transmitting substrate on one side; and a front film in contact with the light-emitting element on the side of the light-transmitting substrate, the front film includes at least three layers including a substrate film and particle-containing resin layers on both surfaces of the substrate film; wherein the resin layer (a first particle-containing layer) on the light incidence side of the front film contains 1 to 50% by weight of the particles and the resin layer (a second particle-containing layer) on the light exiting side of the front film contains 20 to 80% by weight of the particles.

18 Claims, 3 Drawing Sheets

(51) Int. Cl.
   *H01L 51/52*  (2006.01)
   *G02B 5/02*  (2006.01)

(56) References Cited

U.S. PATENT DOCUMENTS

2008/0193742 A1* 8/2008 Maeda et al. .................. 428/331
2009/0072733 A1   3/2009 Funayama et al.

FOREIGN PATENT DOCUMENTS

| JP | 2010-049210 | 3/2010 |
| JP | 2010-218738 | 9/2010 |
| JP | 2011-086527 | 4/2011 |
| WO | 2006/095632 | 9/2006 |
| WO | 2011/093120 | 8/2011 |

OTHER PUBLICATIONS

Tsubaki et al, Japanese Patent Application 2003-109747, Apr. 2003, machine translation.*

Yamazaki, Japanese Patent Application 2010-049210, Mar. 2010, machine translation.*

* cited by examiner

PLANAR LIGHT EMITTING DEVICE AND FRONT FILM

TECHNICAL FIELD

This disclosure relates to a planar light emitting device with a high light extraction efficiency, small color change by viewing angle, and less scattering of broken pieces when the light-transmitting substrate is broken. The disclosure also relates to a front film used for the planar light emitting device.

BACKGROUND

Planar light emitting devices are drawing attention including those using an organic electroluminescence element (The "electroluminescence" may be hereinafter referred to as EL). Since the organic EL element is capable of emitting a light which is white or near white, the planar light emitting device prepared by using such organic EL element can be used for the light source of lighting apparatus and backlight of displays.

Known organic EL elements are composed of components including an organic EL layer, a transparent electrode, and a light-transmitting substrate made of a glass or polymer film, and those elements suffer from non-negligible loss of light when the light emitted by the organic EL layer is extracted to the exterior through the light-transmitting substrate. The efficiency of extracting the emitted light to the exterior (hereinafter referred to as light extraction efficiency) is currently as low as about 20%. In addition, since a white organic EL element is commonly provided with a plurality of light-emitting elements each emitting red, green, and blue colors or yellow and blue colors and refraction and reflection behaviors of the light in each component are different by the wavelength, change in the color due to the difference in the viewing angle (hereinafter referred to as color deviation) is an issue to be solved.

In addition, glass is mainly used for the light-transmitting substrate of the current organic EL element, and the glass has the risk that broken pieces of the glass scatter by the impact at the breaking of the glass.

Exemplary methods employed to improve the light extraction efficiency of the organic EL element include provision of a resin layer containing a light-scattering material (Japanese Patent Application Laid-Open No. 2003-109747) and provision of a light-scattering pressure sensitive adhesive layer (Japanese Patent Application Laid-Open No. 2010-218738) on the surface of the light-transmitting substrate opposite to the side of the light emitter. For the improvement of the light extraction efficiency and reduction of the color deviation as well as prevention of the scattering of the broken light-transmitting substrate, the methods proposed include provision of a particle-containing resin layer between the transparent electrode and the light-transmitting substrate simultaneously with the provision of a lens sheet on the light exiting surface (Japanese Patent Application Laid-Open No. 2011-86527).

However, in the method described in Japanese Patent Application Laid-Open No. 2003-109747, the function of preventing the scattering of the broken pieces of the light-transmitting substrate was lacking, or prevention of the color deviation was insufficient.

In the method of using the light-scattering pressure sensitive adhesive layer described in Japanese Patent Application Laid-Open No. 2010-218738, the light extraction efficiency was insufficient and prevention of the color deviation was also insufficient.

In the method described in Japanese Patent Application Laid-Open No. 2011-86527, a transparent electrode having a thickness of several dozen nm was formed on the resin layer which was already provided with a large surface irregularity due to the light scattering particles, and such formation of the electrode was unrealistic considering the current production technology.

It could therefore be helpful to provide a planar light emitting device with a high light extraction efficiency, a small color change by the viewing angle and, also, with a less scattering of broken pieces when the light-transmitting substrate is broken. It could also be helpful to provide a front film used for the planar light emitting device.

SUMMARY

We thus provide:

1. A planar light emitting device comprising a light-emitting element having a light-transmitting substrate on one side; and a front film in contact with the light-emitting element on the side of the light-transmitting substrate, the front film comprising at least three layers including a substrate film and particle-containing resin layers on both surfaces of the substrate film; wherein the resin layer (a first particle-containing layer) on the light incidence side of the front film contains 1 to 50% by weight of the particles and the resin layer (a second particle-containing layer) on the light exiting side of the front film contains 20 to 80% by weight of the particles.

2. A planar light emitting device according to the above 1 wherein difference in refractive index of the resin and the particles constituting the first particle-containing layer is 0.05 to 0.5.

3. A planar light emitting device according to the above 1 or 2 wherein peel strength between the first particle-containing layer and the light transmitting substrate is at least 0.5 N/25 mm.

4. A planar light emitting device according to any one of the above 1 to 3 wherein the second particle-containing layer contains a UV absorber.

5. A planar light emitting device according to any one of the above 1 to 4 wherein the resin in the second particle-containing layer is the one containing a UV absorber.

6. A planar light emitting device according to any one of the above 1 to 5 wherein the particles in the second particle-containing layer are those containing a UV absorber.

7. A planar light emitting device according to any one of the above 1 to 6 wherein light-emitting element used in the planar light emitting device is an organic electroluminescence light-emitting element.

8. A front film used in any one of the planar light emitting device according to the above 1 to 6.

Our planar light emitting devices have a high light extraction efficiency, reduced color deviation, as well as reduced risk of scattering of broken pieces of the light-transmitting substrate when broken.

Figure 1:
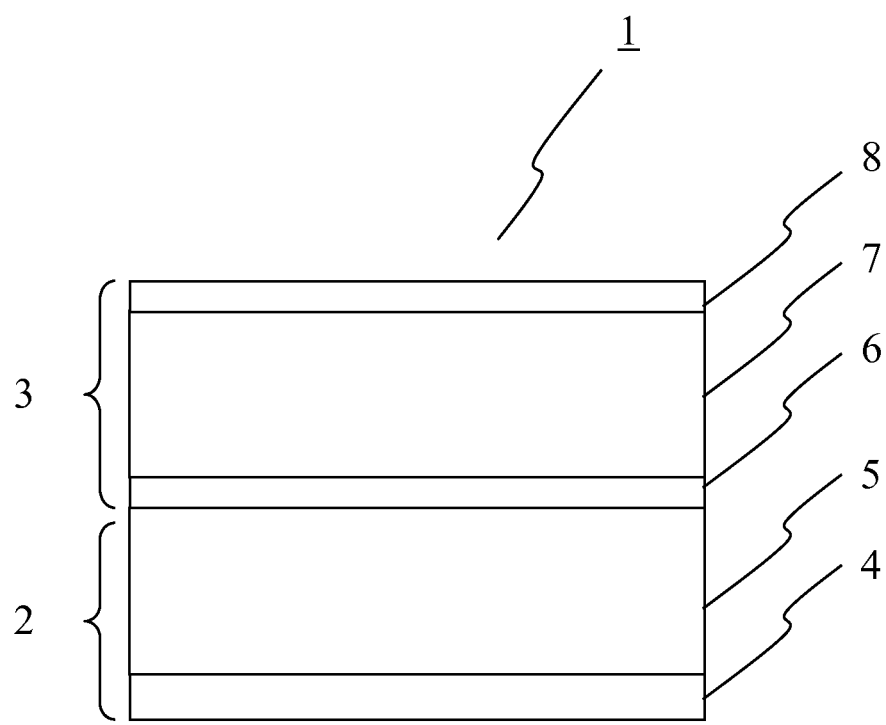
FIG. 1 is a schematic view showing an example of our planar light emitting devices.

EXPLANATION OF NUMERALS 1 planar light emitting device
2 light-emitting element 3 front film
4 light-emitting layer
5 light-transmitting substrate
6 first particle-containing layer
7 substrate film
8 second particle-containing layer
9 sealing layer
10 rear electrode
11 light emitter
12 transparent electrode
13 resin (A)
14 particle (A)
15 resin (B)
16 particle (B)

DETAILED DESCRIPTION

Next, our devices and front films are described by referring to the drawings.

FIG. 1 is a schematic view showing an example of our planar light emitting devices. The planar light emitting device 1 is constituted from a light-emitting element 2 and a front film 3, and the light-emitting element 2 and the front film 3 are arranged in contact with each other. The light-emitting element 2 comprises a light-emitting layer 4 and a light-transmitting substrate 5, and the front film 3 is a laminate comprising three layers, namely, a first particle-containing layer 6, a substrate film 7, and a second particle-containing layer 8 in this order from the side of the light-transmitting substrate 5 of the light-emitting element 2.

The planar light emitting device 1 is not particularly limited as long as it is a plane-shaped light emitter. The term "plane" is not limited to a flat plane, and also included are curved plane at a constant curvature, or irregularly curved plane. The "plane" also includes ones having some surface irregularity in some parts of the plane.

Figure 2:
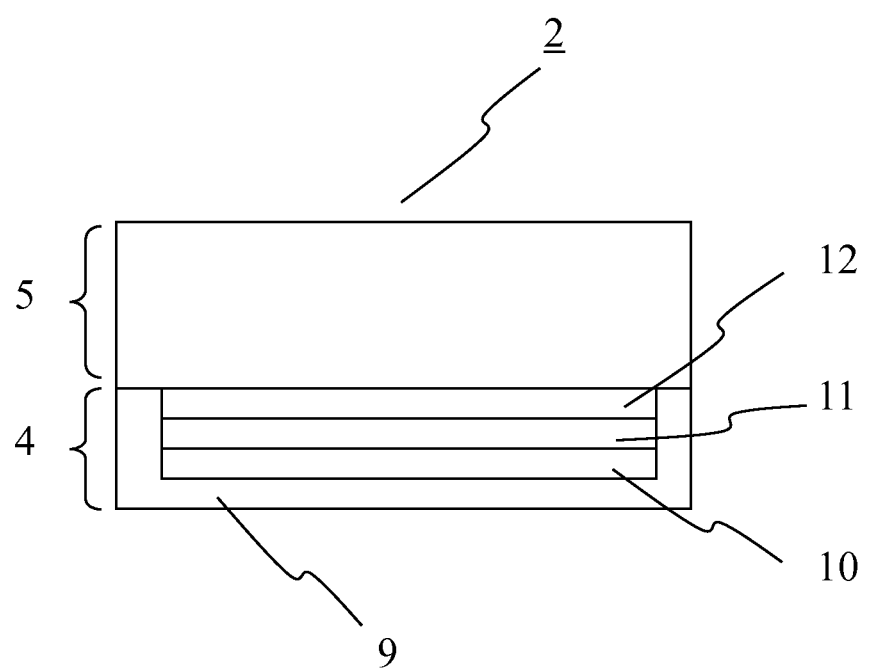
FIG. 2 is a schematic view showing an example of our light-emitting elements.

FIG. 2 is a schematic view showing an example of one of our light-emitting elements. The light-transmitting substrate 5 may comprise a glass substrate or a polymer film substrate and, presently, a glass substrate is mainly used in view of the good gas barrier property. The example of the light-emitting layer 4 shown in FIG. 2 comprises a sealing layer 9, a rear electrode 10, a light emitter 11, and a transparent electrode 12 arranged in this order. The sealing layer 9 is provided to prevent deterioration of the light emitter 11 by invasion of water and oxygen from the rear or side surface. The rear electrode 10 is an electrode having reflectivity which is mostly formed by silver or aluminum. The light emitter 11 may be an organic electroluminescence light emitter or an inorganic electroluminescence light emitter. With regard to the light emitter 11, the light-emitting element prepared by using an organic electroluminescence light emitter is called an organic electroluminescence light-emitting element, and the light-emitting element prepared by using an inorganic electroluminescence light emitter is called an inorganic electroluminescence light-emitting element. The transparent electrode is most often formed from a film of indium tin oxide (hereinafter referred to as ITO).

Figure 3:
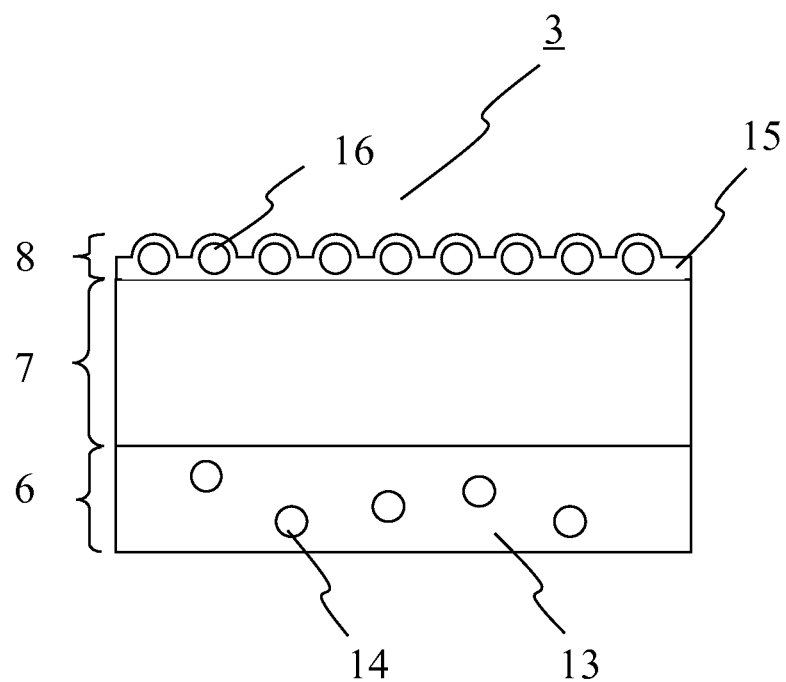
FIG. 3 is a schematic view showing an example of our front film.

FIG. 3 is a schematic view showing an example of one of our on front films. This front film has a three layer constitution. Since the front film 3 is arranged in contact with the light-transmitting substrate 5 of the light-emitting element 2 as described for FIG. 1, the side in contact with the light-transmitting substrate 5 is designated the "incidence" side of the substrate film 7, and the side of the substrate film 7 opposite to the incidence side of is designated the "exiting" side. Also as shown in FIG. 3, the front film has particle-containing resin layers on both surfaces of the front film. The layer on the incidence side is designated the first particle-containing layer 6; the layer on the exiting side is designated the second particle-containing layer 8; the resin constituting the first particle-containing layer 6 is designated a resin (A) 13; the particles in the first particle-containing layer 6 are designated particles (A) 14; the resin constituting the second particle-containing layer 8 is designated a resin (B) 15; and the particles in the second particle-containing layer 8 are designated particles (B) 16. It is to be noted that the substrate film may comprise two or more layers and, for example, a functional layer may be provided on the surface region on the side of the first particle-containing layer and/or on the surface region on the side of the second particle-containing layer.

In the front film used in the planar light emitting device, the first particle-containing layer 6 contains 1 to 50% by weight of the particles (A) 14. When the content is within such a range, the particles (A) 14 will be in the condition embedded in the resin (A) 13 in the first particle-containing layer 6, and the light-transmitting substrate 5 of the light-emitting element 2 can be provided in contact with the first particle-containing layer 6 of the front film 3. The term "in contact with" means that the light-transmitting substrate 5 is in close contact with the first particle-containing layer 6. When an air layer is present between the light-transmitting substrate 5 and the first particle-containing layer 6, loss by light reflection at the air layer will be increased and, therefore, the light-transmitting substrate 5 and the first particle-containing layer 6 should be provided in close contact with each other so that there will be no intervening air layer. The loss by reflection at the interface between the light-transmitting substrate 5 and the first particle-containing layer 6 is thereby reduced. Accordingly, entrapment of a minute amount of air (such entrapped air is called "void") between the light-transmitting substrate 5 and the first particle-containing layer 6 should be minimized, and such a void is preferably up to 1% per unit area. In addition, since the particles (A) 14 are dispersed in the resin (A) 13 in the first particle-containing layer 6, the light transmitted will be scattered due to the difference in the refractive index between the resin (A) 13 and the particles (A) 14.

The second particle-containing layer 8 contains 20 to 80% by weight of the particles (B) 16 in the resin (B) 15. When the content is within such a range, the particles (B) 16 will form protrusions on the surface on the light exiting side of the second particle-containing layer 8. Total reflection at the interface between the second particle-containing layer 8 and the air will then be reduced, and the light will exit from the light exiting side at a high efficiency.

In the constitution of conventional technology wherein only one layer of particle-containing layer had been formed on the incidence side or the exit side of the front film, reduction of color deviation and improvement in light extraction efficiency was in a trade-off relation, and simultaneous realization of these requirements was difficult. In view of such a situation, the we studied whether the light-scattering function of the first particle-containing layer 6 should be effective in reducing the color deviation, and the provision of surface irregularity on the second particle-containing layer 8 should be effective in improving the light extraction efficiency. We discovered the planar light emitting device wherein the reduction of the color deviation and improvement of the light extraction efficiency are simultaneously realized by providing two separate particle-containing layers and controlling the content by weight of the particles to meet the conditions as described above. In addition, a planar light emitting device 1 with reduced risk of the scattering of the broken pieces in the breaking of the light-transmitting substrate was achieved by providing a substrate film 7.

Next, the constituents of the front film are described in detail.

Substrate Film

The material used for the substrate film is not particularly limited and, in view of availability and handling convenience, the substrate film is preferably a plastic film. Exemplary materials for the plastic film include polyolefin, polyester, polycarbonate, polyether, polyamide, polyimide, and polyacrylic resins. Among these, the preferred are films of a polyester material in views of durability and the like, and the most preferred is use of polyethylene terephthalate (hereinafter referred to as PET) in view of the availability.

The film used for the substrate film may be a film produced by conducting a monoaxial or biaxial stretching in the course of its production or a film produced without such stretching step. Preferred is a film produced by conducting a biaxial stretching in the course of its production due to the superior strength. The degree of stretching in such stretching step may be determined with all things considered based on the strength and film formation ability.

In addition, the substrate film may be either a transparent film or a film which has been made translucent by adding an organic and/or inorganic particles or hollow spaces for scattering the light. The film, however, is preferably a non-colored film.

The film used for the substrate film may be a so-called mono-layer film comprising one type of material, a composite film comprising two or more materials, or a film having a functional layer disposed on its surface. The film may be selected based on the required properties.

The substrate film is not particularly limited for its thickness. However, the substrate film may preferably have a thickness of at least 10 μm and up to 500 μm since the thickness of less than 10 μm may result in the difficulty of handling while the thickness in excess of 500 μm may result loss of the light in the substrate film. The substrate film may preferably have a thickness of at least 30 μm and up to 300 μm, and more preferably at least 50 μm and up to 200 μm. The boundary between the substrate film and the first or the second particle-containing layer may be identified by observing the cross-section with an electron microscope or by measuring the thickness with a laser microscope.

First Particle-Containing Layer

The first particle-containing layer contains the particles (B) in the resin (A).

The resin (A) used in the first particle-containing layer is not particularly limited, and preferred is a resin containing an organic component as its main component. Exemplary such resins include polyester resin, polyurethane resin, acrylic resin, methacrylic resin, polyamide resin, polyethylene resin, polypropylene resin, polyvinyl chloride resin, polyvinylidene chloride resin, polystyrene resin, polyvinyl acetate resin, fluororesin, epoxy resin, and silicone resin. The resin containing an organic component as its main component means the resin (A) used in the first particle-containing layer containing at least 60% by weight of the organic component, and the content of the organic component is more preferably at least 80% by weight (the same applies for the definition of the "main component" in the following description). These resins may be used alone or in combination of two or more in the form of a copolymer or a mixture. Among these, preferred are polyester resin, polyurethane resin, acrylic resin, and methacrylic resin in view of the heat resistance, appearance, and particle dispersion.

The peel strength between the first particle-containing layer and the light-transmitting substrate is preferably at least 0.5 N/25 mm in view of the durability, and more the peel strength is more preferably at least 1 N/25 mm and still more preferably at least 2 N/25 mm. In addition, the peel strength between the first particle-containing layer and the light-transmitting substrate of up to 50 N/25 mm is practically sufficient since the peel strength in excess of 50 N/25 mm does not contribute for the durability as described above. In view of enabling the replacement of the front film alone in the case of, for example, scratches on the front film 3, the peel strength is preferably up to 40 N/25 mm, and most preferably up to 30 N/25 mm.

The peel strength between the first particle-containing layer and the light-transmitting substrate is defined as a value measured by the method described in "(6) Peel strength between the first particle-containing layer and the light-transmitting substrate" in the section of Examples as described below.

Exemplary resins used in the first particle-containing layer to realize the peel strength between the first particle-containing layer and the light-transmitting substrate within such a preferable range include polyester resin, polyurethane resin, acrylic resin, epoxy resin, and silicone resin, which may be used alone or in combination of two or more in the form of a copolymer or a mixture. Among these, preferred is the acrylic resin in view of water resistance, heat resistance, light resistance, and other properties related to the reliability as well as transparency in addition to the realization of the peel strength between the first particle-containing layer and the light-transmitting substrate within such range.

It is to be noted that the material is preferably selected by considering various conditions required in subsequent production of a planar light emitting device, namely, in disposing the front film 3 so that the first particle-containing layer 6 will be in contact with the light-transmitting substrate 5 by the method (ii) as will be described later. More specifically, the material is preferably selected in view of the low glass transition temperature (for example, 220 to 250 K) required to realize the contact area by deformation through flowing, the low surface energy required for realization of sufficient wettability, the adequately selected molecular weight of each material in obtaining the cohesion force, and the like so that the surface of the first particle-containing layer 6 will be provided with the pressure sensitive adhesive property required for direct adhesion of the first particle-containing layer 6 with the light-transmitting substrate 5. Exemplary materials satisfying such requirements include acrylic pressure sensitive adhesive "SK-Dyne (registered trademark)" (manufactured by Soken Chemical & Engineering Co., Ltd.) and acrylic pressure sensitive adhesive "Oribine (registered trademark)" (manufactured by Toyo Ink Co., Ltd.). In addition, the crosslinking density of the material should be adjusted to optimize the balance between flow deformation in wetting and resistance against peeling by selecting the type and amount of the crosslinking agent (an isocyanate curing agent).

The particles (A) used in the first particle-containing layer may have a flat shape such as star, leaf, or disk, a non-spherical steric shape such as pyramid, cuboid, needle, Moravian star, or amorphous, or a sphere-like shape (which is not necessarily a true sphere but also including the one surrounded by a curved surface with the cross section of circle, oblong, semi-circle, semi-oblong, or the like). The particles having such shape may be porous, non-porous, or hollow, and the particles may be a mixture of the particles having different shapes. The particles, however, are preferably spherical particles in view of uniformly scattering the light.

The material used for the particles (A) of the first particle-containing layer may be either an organic compound or an inorganic compound, and the material is not particularly limited. The material used may also be the one prepared by mixing particles of different materials.

When the material used for the particles (A) of the first particle-containing layer is an organic compound, the compound is preferably a resin containing a crosslinkable polymer component having a high melting point as its main component. Exemplary such organic compounds include polyester resin, resin of a polyamide such as benzoguanamine, polyurethane resin, acrylic resin, methacrylic resin, polyamide resin, polyethylene resin, polypropylene resin, polyvinyl chloride resin, polyvinylidene chloride resin, polystyrene resin, polyvinyl acetate resin, fluororesin, and silicone resin. These resins may be used alone or in combination of two or more in the form of a copolymer or a mixture.

Exemplary inorganic compounds when the material used for the particles (A) of the first particle-containing layer is an inorganic compound include calcium carbonate, magnesium carbonate, zinc carbonate, titanium oxide, zinc oxide, cerium oxide, magnesium oxide, barium sulfate, zinc sulfide, sodium phosphate, silica, alumina, mica, mica titanium, talc, clay, kaolin, lithium fluoride, calcium fluoride.

Of these, the material used for the particles (A) of the first particle-containing layer is preferably acrylic resin, methacrylic resin, polyamide resin, epoxy resin, melamine resin, or the like in view of the excellent optical properties and solvent resistance.

Average particle diameter of the particles used in the first particle-containing layer is preferably 0.1 to 30 µm, more preferably 0.5 to 20 µm, and more preferably 1.0 to 10 µm. When the average particle diameter is less than 0.1 µm, the effect of adding the particles is not explicit, and the light scattering may become reduced. On the other hand, the average particle diameter in excess of 30 µm may result in the poor appearance. The term average particle diameter as used herein means the number average particle diameter and, more specifically, the number average of the particle diameter measured by the measurement procedure described in the section of Examples (this also applies for the particles (B) of the second particle-containing layer).

Content of the particles in the first particle-containing layer is 1 to 50% by weight, preferably 1 to 40% by weight, more preferably 1 to 30% by weight, and more preferably 1 to 20% by weight. When the content of the particles content is less than 1% by weight, the effect of adding the particles is not explicit, and the light scattering may become reduced. On the other hand, the particle content in excess of 50% by weight may result in the excessive optical scattering and, hence, reduced light extraction efficiency. The content of the particles as used herein means weight proportion of the particles in relation to the total weight of the substance constituting the first particle-containing layer.

The difference in the refractive index between the resin constituting the first particle-containing layer and the particles is preferably 0.05 to 0.5, and more preferably 0.05 to 0.3. When the difference in the refractive index is less than 0.05, the light scattering may be insufficient, while the difference in the refractive index of more than 0.5 may result in the excessive interior scattering. Hence, in the reduced total light transmittance, this may invite loss of light-extraction efficiency.

The first particle-containing layer preferably contains a UV absorber. When the first particle-containing layer contains a UV absorber, deterioration of the first particle-containing layer and the light-emitting element by the daylight (UV) can be suppressed. The UV absorber used may be selected from those mentioned for the second particle-containing layer as described below.

The first particle-containing layer is not particularly limited in its thickness. The thickness, however, is preferably 0.3 to 70 µm. The thickness of less than 0.3 µm may result in the poor outer appearance while the thickness in excess of 70 µm may invite increase in the cost of the material. The thickness of the first particle-containing layer is more preferably 1 to 60 µm, and more preferably 3 to 50 µm, namely, several times the average particle diameter of the particles in the layer.

Second Particle-Containing Layer

The second particle-containing layer contains the resin (B) and the particles (B).

The resin (B) used for the second particle-containing layer may be selected from the group of materials similar to those mentioned for the resin (A) of the first particle-containing layer. The resin, however, may not necessarily be the same as that of the first particle-containing layer.

The shape of the particles (B) used for the second particle-containing layer may be selected from a group similar to the one mentioned for the particles (A) of the first particle-containing layer, and the particles may preferably have a spherical shape. When the particles have a spherical shape, the extracted light is more likely to irradiate the front direction.

The material used for the particles (B) of the second particle-containing layer may be selected from the group of materials similar to those mentioned for the particles (A) of the first particle-containing layer.

Average particle diameter of the particles used in the second particle-containing layer is preferably 0.3 to 30 µm, more preferably 0.5 to 20 µm, and most preferably 1.0 to 10 µm. Use of the particles having the average particle diameter of less than 0.3 µm may invite color deviation since optical behavior of the light is changed by the surface irregularities formed on the surface of the second particle-containing layer depending on the wavelength. On the other hand, the average particle diameter in excess of 30 µm may result in a poor appearance. The average particle diameter of the particles used for the second particle-containing layer is preferably greater than average thickness of the second particle-containing layer measured by the procedure described in the section of Examples in view of facilitating provision of surface irregularities by the particles on the surface of the second particle-containing layer. The term average particle diameter as used herein means the number average particle diameter and, more specifically, the number average of the particle diameter measured by the measurement procedure described in the section of Examples.

Content of the particles used for the second particle-containing layer is typically 20 to 80% by weight, preferably 30 to 80% by weight, and more preferably 40 to 80% by weight. When the content is less than 20% by weight, the surface irregularity formed on the surface will be insufficient, and the effect of adding the particles may be insufficient. On the other hand, a content in excess of 80% by weight may result in a poor appearance. The content of the particles as used herein is the proportion of the particle weight in relation to the total weight of the substance constituting the second particle-containing layer.

The second particle-containing layer may also contain an additive such as a curing agent, a crosslinking agent, or a UV absorber. The second particle-containing layer preferably contains a UV absorber to prevent deterioration of the substrate film and the light-emitting element by the UV ray in the daylight. Preferably, the second particle-containing layer may also contain a UV absorber and a photostabilizer.

Exemplary UV absorbers include organic UV absorbers such as benzophenone absorbers, benzotriazole absorbers, triazine absorbers, cyanoacrylate absorbers, salicylic acid absorbers, benzoate absorbers, and salicylic anilide absorbers, and also, inorganic UV absorbers such as titanium oxide, zinc oxide, cerium oxide, and zirconium oxide.

Exemplary compounds which may be used as an organic UV absorber include:

salicylic acid compounds: p-t-butylphenyl salicylate, p-octylphenyl salicylate;

benzophenone compounds:
2,4-dihydroxybenzophenone, 2-hydroxy-4-methoxybenzophenone, 2-hydroxy-4-methoxy-5-sulfobenzophenone, 2,2'-4,4'-tetrahydroxybenzophenone, 2,2'-dihydroxy-4-methoxybenzophenone, 2,2'-dihydroxy-4,4'-dimethoxybenzophenone, bis(2-methoxy-4-hydroxy-5-benzoylphenyl)methane;

benzotriazole compounds:
2-(2'-hydroxy-5'-methylphenyl)benzotriazole, 2-(2'-hydroxy-5'-t-butylphenyl)benzotriazole, 2-(2'-hydroxy-3', 5'-di-t-butylphenyl)benzotriazole, 2-(2'-hydroxy-3'-t-butyl-5'-methylphenyl)-5-chlorobenzotriazole, 2-(2'-hydroxy-3',5'-di-t-butylphenyl)-5-chlorobenzotriazole, 2-(2'-hydroxy-5'-t-octylphenol)benzotriazole, 2-(2'-hydroxy-3',5'-di-t-amylphenyl)benzotriazole, 2,2'-methylenebis [4-(1,1,3,3-tetramethylbutyl)-6-(2H-benzotriazole-2-yl)phenol], 2(2'hydroxy-5'-methacryloxy phenyl)-2H-benzotriazole, 2-[2'-hydroxy-3'-(3",4",5", 6"-tetrahydrophthalimide methyl)-5'-methylphenyl] benzotriazole;

cyanoacrylate compounds: ethyl-2-cyano-3,3'-diphenyl acrylate; and other compounds:
2-ethoxy-2'-ethyloxalic acid bisanilide, 2-(4,6-diphenyl-1, 3,5-triazine-2-yl)-5-[(hexyl)oxy]-phenol.

The compounds as described above may be used alone or in combination of two or more.

These UV absorbers are capable of absorbing the UV light while they are not provided with the capability of scavenging the radicals generated by the exposure to UV and, as a result, the product is subject to deterioration by the organic radicals generated by exposure to UV. In such a case, use of a photostabilizer in combination with the UV absorber for the scavenging of the organic radical is preferable.

Exemplary compounds which may be used as a photostabilizer include:

hindered amine compounds: bis(2,2,6,6-tetramethyl-4-piperidyl)sebacate, and polycondensation product of dimethyl succinate and 1-(2-hydroxyethyl)-4-hydroxy-2,2,6,6-tetra methylpiperidine;

benzoate compounds: 2,4-di-t-butylphenyl-3',5'-di-t-butyl-4'-hydroxybenzoate, and 2,4-di-t-butylphenyl-3',5'-di-t-butyl-4'-hydroxybenzoate; and hindered phenol compounds: octadecyl-3-(3,5-di-t-butyl-4-hydroxyphenyl)propionate, and N,N'-hexamethylene bis (3,5-di-t-butyl-4-hydroxysinnamamide). Among these, preferred is the hindered amine compounds in view of the high radical scavenger capacity and less coloring.

The compound as described above may be used alone or in combination of two or more.

Typical examples of incorporating the UV absorber in the second particle-containing layer include: A) an example wherein the UV absorber is incorporated in the coating composition of the second particle-containing layer; B) an example wherein a resin containing the UV absorber is used in the skeleton of the resin (B) constituting the second particle-containing layer; and C) an example wherein the particles containing the UV absorber is used for the particles (B) constituting second particle-containing layer. Of these example, preferred are examples C) or B) in suppressing bleed out of the UV absorber.

Since content of the particles (B) in the second particle-containing layer is relatively high (20 to 80% by weight), use of at least the example C) is preferable, and a combination of the examples B) and C) is more preferable in views of improving UV absorbing efficiency.

In the example B) wherein a resin containing the UV absorber is used in the skeleton of the resin (B) constituting the second particle-containing layer, a resin obtained by copolymerizing the resin component constituting the resin (B) and a UV absorber is used. In such a case, a photostabilizer is preferably also copolymerized with the resin. Examples of such resin include "HALSHYBRID (registered trademark)" series (manufactured by Nippon Shokubai Co., Ltd.) containing a copolymerization product of acryl monomer, a UV absorber, and a photostabilizer as the effective component.

The particles containing the UV absorber of C) may be obtained, for example, by copolymerizing the UV absorber having a reactive double bond with the resin constituting the particles (B) in the course of its production. Preferably, the resin constituting the particle (B) also has a photostabilizer having a reactive double bond copolymerized therewith.

The monomer having a reactive double bond in the UV absorber having a reactive double bond or the photostabilizer having a reactive double bond is preferably a vinyl monomer such as an acryl or a styrene monomer. Since vinyl monomers of styrene series have the aromatic ring, they are more likely to become yellow, and in view of the light resistance, the preferred vinyl monomers are acryl monomers.

For example, 2-(2'-hydroxy-5'-methacryloxyethyl phenyl)-2H-benzotriazole ("RUVA (registered trademark)"-93 manufactured by Otsuka Chemical Co., Ltd.) may be used as a UV absorber (benzotriazole) having a reactive vinyl monomer bonded thereto. 4-methacryloyloxy-2,2,6,6-tetra methylpiperidine ("Adecastab (registered trademark)" LA-82 manufactured by ADEKA Corporation) may be used as a photostabilizer (hindered amine compound) substituted with a reactive vinyl monomer.

Content of the UV absorber in the second particle-containing layer is preferably 0.1 to 30% by weight. At a content of less than 0.1% by weight, UV absorbing performance may not be sufficient, and the planar light emitting device may suffer from a short life. A content in excess of 30% by weight results in the non-negligible absorption of the light of the visible range light having a short wavelength, and this may invite loss of light-emitting efficiency or insufficiency in the strength of the second particle-containing layer. The content of the UV absorber in the second particle-containing layer is preferably 0.5 to 10% by weight, and more preferably 1 to 5% by weight. The content of the UV absorber as used herein means the proportion of the UV absorber in the total weight of the substance constituting the second particle-containing layer.

It is to be noted that, when the resin (B) is a UV absorber-containing resin or the particle (B) is a UV absorber-containing particle, the weight ratio of the UV absorber in the resin (B) or the particle (B) may be determined by the analysis using NMR or the like.

The second particle-containing layer is not particularly limited for its thickness. The thickness, however, is preferably 0.3 to 30 μm. The thickness of less than 0.3 μm may result in a poor appearance while a thickness in excess of 30 μm may result in an unduly increased cost of the material. The thickness of the second particle-containing layer is more preferably 1 to 20 μm, and still more preferably, 3 to 10 μm, which is approximately a few tenth of the average particle diameter of the particles in the second particle-containing layer.

The method used to dispose the first and the second particle-containing layer are not particularly limited, and various methods such as gravure coating, roll coating, dye coating, spin coating, reverse coating, bar coating, screen coating, blade coating, air knife coating, and dipping may be used. The first and the second particle-containing layer may be formed either in the production of the film used for the substrate layer (inline coating) or in a different step after forming and winding the film used for the substrate layer offline coating).

Light-Emitting Element

The light-emitting element is not particularly limited as long as it has a light-transmitting substrate. More specifically, the light-emitting element may be a conventional device comprising a light-transmitting substrate formed from, for example, a glass or a polymer film, and a transparent electrode comprising a film of an indium tin oxide (hereinafter referred to as ITO) or the like and a light-emitting layer formed on the light-transmitting substrate. The light-emitting element may also comprise a reflective electrode (typically comprising silver or aluminum) disposed thereon. If desired, the light-emitting element may optionally have a charge transport layer or a plurality of light-emitting layer. These devices are known to be degraded by water or oxygen and, therefore, the device is preferably also sealed with a sealant on the back surface or side surface. Preferred is an organic electroluminescence light-emitting element wherein the light emitter used for the light-emitting layer is an organic electroluminescence light emitter.

Production Method of the Planar Light Emitting Device

The method used in producing the planar light emitting device is not particularly limited. Typical method is as described below.

On the light-transmitting substrate of the light-emitting element, the front film comprising the material described in the section of the constituents of the front film is disposed so that the first particle-containing layer 6 is in contact with the light-transmitting substrate 5. Exemplary methods to dispose the front film include (i) a method wherein a pressure sensitive adhesive is coated on the first particle-containing layer for adhesion; and (ii) a method wherein an adequate glass transition temperature, a molecular weight, a crosslinking density, or the like is adjusted or selected for the resin (A) in formation of the first particle-containing layer to thereby obtain a first particle-containing layer having a surface with pressure sensitive adhesive property, and the first particle-containing layer is then directly adhered to the light-transmitting substrate. Of these, preferred is the latter method considering the smaller number of inter-layer boundaries which is inherently associated with the risk of loss by the reflection of the light.

EXAMPLES

Next, our devices and front films are described in further detail by referring to the Examples, which by no means limit the scope of this disclosure.

The measurement and evaluation were conducted by the procedure as described below. Unless otherwise noted, the evaluation was carried out at n=1.

(1) Measurement of the Light Extraction Efficiency

After turning on the planar light emitting device and allowing the planar light emitting device to stand for 30 minutes, the measurement was carried out by using a viewing angle tester EZContrast (manufactured by ELDIM) to measure the entire flux. The ratio for each level was determined by assuming the entire flux of the light-transmitting substrate having no front film as 100%.

(2) Evaluation of the Color Deviation

The planar light emitting device was turned on and allowed to stand for 30 minutes before conducting the evaluation. Samples at various levels were visually confirmed at an angle 0 to 60 degrees (the direction normal to the sample surface being 0 degrees) to thereby evaluate the color deviation in 4 grades.

1. color deviation of the level equivalent to the planar light emitting device having no front film is confirmed;
2. between 1 and 3 (with some improvement over 1 but still at a practically unacceptable level);
3. color deviation is visually confirmed but at a level barely acceptable for practical use;
4. between 3 and 5; and
5. no color deviation confirmed.

(3) Evaluation of the Shape of the Particles in the First and the Second Particle-Containing Layers and Average Thickness of These Layers The planar light emitting device was cut in the direction perpendicular to the plane of the planar light emitting device by using a rotary microtome manufactured by Nihon Microtome Laboratory, Inc. with a knife inclined at an angle of 3 degrees. By using the resulting cross section, the shape of the particles in the first and the second particle-containing layer was observed by using a scanning electron microscope ABT-32 manufactured by Topcon Corporation so that the film layer would be in the visual field. This observation was conducted at a magnification of 2500 to 10000 with the image contrast controlled. By using the same cross sectional image as the one used for the observation, the thickness of the layer (the thickness including the particle or the protrusion when such particle is present at the point measured) was calculated at the points equally dividing the width of the image into 20 parts, and the arithmetic mean of 21 points including the points at opposite ends was determined. The same procedure was repeated at the same magnification for 5 points, and the average was used for the average thickness of the particle-containing layer.

(4) Measurement of the Number Average Particle Diameter

The average particle diameter was determined from the images of the surface of the first and the second particle-containing layers taken for observation by using a laser microscope VK-8700 (manufactured by Keyence Corporation). Straight lines were drawn in the length and width directions to rule squares and divide the image into 11 equal parts in each direction. The particle nearest to each of the 100 points of intersection of the lines was measured for its diameter in mutually perpendicular two directions. The average was used as the diameter of the particle, and the arithmetic mean of these diameters was used as the number average particle diameter. When the nearest particle is the same for two or more points of intersection, only one point is used, and the image observed is added until the number of particles to be measured is 80 or more.

(5) Method Used to Measure the Refractive Index

The resin was extracted from the particle-containing layer by using an organic solvent and, after removing the organic solvent from the extract, the measurement was conducted by ellipsometry for the light having a wavelength of 589.3 nm at 25° C. The resulting value was used for the "refractive index of the resin".

Next, the particle-containing layer was immersed in an organic solvent and the coating layer was collected by peeling. The coating layer was pushed against a slide glass and slid along the slide glass to remove the particles off the coating layer. The particles were collected until the total weight of the particles was 10 g. The refractive index of the collected particles was determined by observing Becke's line for each liquid organic compound at a temperature at which the refractive index is known to confirm the disappearance of the contour of the particles. The refractive index of the liquid organic compound used at such instance was used for the "refractive index of the particles".

(6) Peeling Strength Between the First Particle-Containing Layer the Light-Transmitting Substrate The front film of the planar light emitting device was cut at a width of 25 mm to prepare the test sample. This test sample was stored in an atmosphere at a temperature 23° C. and a relative humidity of 50% for 30 minutes, and peel strength at the peeling at 180 degrees of this test sample was measured in the same atmosphere according to JIS-Z0237 (2000) by using a tensile tester (for example, "TENSILON® RTM-100" manufactured by Orientech Co. LTD.) at a tensile speed of 300 mm/minute.

Evaluation of (1) and (2) was conducted by using a white organic EL light-emitting panel (standard panel manufactured by Lumiotec with the light emitting area size of 145 mm×145 mm which is hereinafter referred to as the light-emitting panel A).

In all of the Examples and Comparative Examples, the film used for the substrate film was PET film "Lumirror (registered trademark)" T60 (manufactured by Toray Industries, Inc.) having a thickness of 125 μm.

Example 1

A coating composition A was prepared by mixing 9.0 g of an acrylic resin ("Acrydic (registered trademark)" A-165 manufactured by DIC Corporation which is a solution having a concentration of 45% by weight), 9.0 g of toluene, and 0.5 g of melamine—slice composite particles "Optobeads (registered trademark)" 2000M (manufactured by Nissan Chemical Industries, LTD having a number average particle diameter of 2.0 μm). In the first particle-containing layer prepared by using the coating composition A, the refractive index of the resin (A) was 1.50, and the refractive index of the particle (A) was 1.65 and, accordingly, the difference in the refractive index was 0.15.

A coating composition B was prepared by mixing 9.0 g of an acrylic resin ("Acrydic (registered trademark)" A-165 manufactured by DIC Corporation which is a solution having a concentration of 45% by weight), 15.0 g of toluene, and 6.0 g of MBX-5 in crosslinkable polymethyl methacrylate particles "TECHPOLYMER (registered trademark)" MBX series (manufactured by Sekisui Plastics Co., Ltd., number average particle diameter 5.0 μm). The coating composition A was coated on one surface of the substrate film with a meter bar #16, and the coating was dried by heating to 120° C. for 1 minute to form the first particle-containing layer. The coating composition B was coated on the other surface of the substrate film by using a wire bar #16 and the coating was dried by heating to 120° C. for 1 minute to form the second particle-containing layer. The first particle-containing layer and a light-emitting panel A of the front film were adhered by using an acrylic pressure sensitive adhesive TD43A (manufactured by OMOEGAWA Co., Ltd.) for the pressure sensitive adhesive while avoiding entrapment of the air, and pressure was applied by moving a rubber roller back and forth once at 2 kg/25 mm to thereby prepare a pseudo-sample of the planar light emitting device.

Example 2

Coating composition C was prepared by mixing 100.0 g of an acrylic pressure sensitive adhesive "SK-Dyne (registered trademark)" 811 (manufactured by Soken Chemical & Engineering Co., Ltd., a solution at a concentration of 23% by weight), 1.5 g of an isocyanate curing agent "D-90" (manufactured by Soken Chemical & Engineering Co., Ltd., a solution at a concentration of 90% by weight), and 2.9 g of epoxy particles "Toraypearl (registered trademark)" EP-B (manufactured by Toray Industries, Inc.; number average particle diameter, 5.5 μm). In the first particle-containing layer prepared by using the coating composition C, the refractive index of the resin (A) was 1.51, the refractive index of the particle (A) was 1.59 and, accordingly, the difference in the refractive index was 0.08.

The coating composition B was coated on one surface of the substrate film by using a meter bar #12, and the coating was dried by heating to 120° C. for 1 minute to form the second particle-containing layer. The coating composition C was coated on the other surface of the substrate film with an applicator to a coating thickness of 100 μm, and the coating was dried by heating to 100° C. for 2 minute to form the second particle-containing layer having a pressure sensitive adhesion property. The front film was thereby prepared. The first particle-containing layer and a light-emitting panel A of the front film were adhered while avoiding entrapment of the air, and pressure was applied by moving a rubber roller back and forth once at 2 kg/25 mm to thereby prepare a pseudo-sample of the planar light emitting device.

Example 3

Coating composition D was prepared by mixing 109.5 g of an acrylic pressure sensitive adhesive "Oribine (registered trademark)" EG-655" (manufactured by Toyo Ink Co., Ltd., a solution at a concentration of 21% by weight), 2.7 g of isocyanate curing agent "BXX5627" (manufactured by Toyo Ink Co., Ltd., a solution at a concentration of 50% by weight), and 2.9 g of epoxy particles "Toraypearl (registered trademark)" EP-B (manufactured by Toray Industries, Inc.; number average particle diameter, 5.5 μm). In the first particle-containing layer prepared by using the coating composition D, the refractive index of the resin (A) was 1.51, and the refractive index of the resin (A) was 1.59 and, accordingly, the difference in the refractive index was 0.08.

The coating composition B was coated on one surface of the substrate film by using a meter bar #12, and the coating was dried by heating to 120° C. for 1 minute to form the second particle-containing layer. The coating composition D was coated on the other surface of the substrate film with an applicator to a coating thickness of 100 μm, and the coating was dried by heating to 100° C. for 2 minute to form the second particle-containing layer having a pressure sensitive adhesion property. The front film was thereby prepared. The first particle-containing layer and a light-emitting panel A of the front film were adhered while avoiding entrapment of the air, and pressure was applied by moving a rubber roller back and forth once at 2 kg/25 mm to thereby prepare a pseudo-sample of the planar light emitting device.

Example 4

Coating composition E was prepared by mixing 10.0 g of benzotriazole-containing acrylic copolymer resin "HALSHYBRID (registered trademark)" UV-G720T (manufactured by Nippon Shokubai Co., Ltd., a solution at a concentration of 40% by weight), 14.0 g of ethyl acetate, and 1.0 g of the particles prepared as described below.

The particles were prepared by the procedure as described below.

A 1 liter four-necked flask equipped with an agitator, a thermometer, and a nitrogen gas introducer was charged with 70 parts by weight of methyl methacrylate, 10 parts by weight of trimethylolpropane triacrylate as a crosslinkable polyfunctional monomer, 3 parts by weight of 2,2,6,6-tetramethyl-4-piperidyl methacrylate as a hindered amine polymerizable compound, 10 parts by weight of 2-(2'-hydroxy-5'-methacryloxyethylphenyl)-2H-benzotriazole as a benzotriazole polymerizable compound, and 1 part by weight of lauroyl peroxide as a polymerization initiator. In addition, 1 part by weight of polyvinyl alcohol (PVA-224, manufactured by KURARAY CO., LTD.) and 200 parts by weight of water were added and as dispersants of this solution. These were agitated by using a homomixer at a rotation of 9000 rpm for 3 minutes to disperse the polymerizable compound in water. This dispersion was then heated to 75° C., and the dispersion was kept at this temperature for 2 hours to promote the reaction. The temperature was further raised to 90° C. and kept at that temperature for 3 hours to promote the copolymerization.

After the reaction as described above, the dispersion was cooled to room temperature. The dispersion was then filtered through a mesh filter having an opening of 40 μm to remove aggregates and the like. The resulting dispersion was free from the aggregates, and filterability of this dispersion was very favorable. The particles dispersed in the thus obtained filtrate had an average particle diameter of 6.4 μm, and particles were spherical. The particle dispersion was filtered to separate the particles from the dispersion medium, and the thus separated particles were dried.

The coating composition E was coated on one surface of the substrate film by using a meter bar #12, and the coating was dried by heating to 120° C. for 1 minute to form the second particle-containing layer. The coating composition C was coated on the other surface of the substrate film with an applicator to a coating thickness of 100 μm, and the coating was dried by heating to 100° C. for 2 minute to form the second particle-containing layer having a pressure sensitive adhesion property. The front film was thereby prepared. The first particle-containing layer and a light-emitting panel A of the front film were adhered while avoiding entrapment of the air, and a pressure was applied by moving a rubber roller back and forth once at 2 kg/25 mm to thereby prepare a pseudo-sample of the planar light emitting device.

Comparative Example 1

The coating composition B was coated on one surface of the substrate film by using a meter bar #12, and the coating was dried by heating to 120° C. for 1 minute to form the second particle-containing layer. The surface on the other side of the second particle-containing layer and a light-emitting panel A of the front film were adhered with an acrylic pressure sensitive adhesive TD43A (manufactured by OMOEGAWA Co., Ltd.) for the pressure sensitive adhesive while avoiding entrapment of the air, and pressure was applied by moving a rubber roller back and forth once at 2 kg/25 mm to thereby prepare a pseudo-sample of the planar light emitting device.

Comparative Example 2

The coating composition C was coated to a coating thickness before drying of 100 μm on one surface of the substrate film with an applicator, and the coating was dried by heating to 100° C. for 2 minutes to form the first particle-containing layer. The first particle-containing layer and the light-emitting panel A of the front film were adhered while avoiding entrapment of the air, and pressure was applied by moving a rubber roller back and forth once at 2 kg/25 mm to thereby prepare a pseudo-sample of the planar light emitting device.

The results of the evaluation in the Examples and Comparative Examples as described above are shown in Table 1.

TABLE 1

| Level | First particle-containing layer | | | | Peel strength between the first particle-containing layer and the light-transmitting substrate [N/25 mm] | Second particle-containing layer | | | Properties | |
|---|---|---|---|---|---|---|---|---|---|---|
| | Particles (A) | | | Difference | | Particles (B) | | | Light | |
| | Content by weight [%] | Number average particle diameter [μm] | Thickness [μm] | in the refractive index | | Content by weight [%] | Number average particle diameter [μm] | Thickness [μm] | extraction efficiency [%] | Color deviation |
| Example 1 | 11 | 2.0 | 5 | 0.15 | 5.1 | 60 | 5.0 | 8 | 108 | 3 |
| Example 2 | 11 | 5.5 | 30 | 0.08 | 2.3 | 60 | 5.0 | 8 | 109 | 4 |
| Example 3 | 11 | 5.5 | 20 | 0.08 | 3.0 | 60 | 5.0 | 8 | 109 | 4 |
| Example 4 | 11 | 5.5 | 30 | 0.08 | 2.3 | 20 | 6.4 | 7 | 105 | 4 |
| Comp. Example 1 | — | — | — | — | 5.1 | 60 | 5.0 | 8 | 110 | 2 |
| Comp. Example 2 | 11 | 5.5 | 30 | 0.08 | 2.3 | — | — | — | 101 | 1 |

What is claimed is:

1. A planar light emitting device comprising:
    a light-emitting element having a light-transmitting substrate on one side; and
    a front film in contact with the light-emitting element on the one side of the light-transmitting substrate, the front film comprising at least three layers including a substrate film and particle-containing resin layers on both surfaces of the substrate film;
    wherein the resin layer which is a first particle-containing layer on the light incidence side of the front film contains 1 to 30% by weight of the particles and the resin layer which is a second particle-containing layer on the light exiting side of the front film contains 40 to 80% by weight of the particles.

2. The device according to claim 1, wherein a difference in refractive index of the resin and the particles constituting the first particle-containing layer is 0.05 to 0.5.

3. The device according to claim 1, wherein a peel strength between the first particle-containing layer and the light transmitting substrate is at least 0.5 N/25 mm.

4. The device according to claim 1, wherein the second particle-containing layer contains a UV absorber.

5. The device according to claim 1, wherein the resin in the second particle-containing layer contains a UV absorber.

6. The device according to claim 1, wherein the particles in the second particle-containing layer contain a UV absorber.

7. The device according to claim 1, wherein the light-emitting element is an organic electroluminescence light-emitting element.

8. A front film used in the planar light emitting device according to claims 1.

9. The device according to claim 2, wherein a peel strength between the first particle-containing layer and the light transmitting substrate is at least 0.5 N/25 mm.

10. The device according to claim 2, wherein the second particle-containing layer contains a UV absorber.

11. The device according to claim 3, wherein the second particle-containing layer contains a UV absorber.

12. The device according to claim 2, wherein the resin in the second particle-containing layer contains a UV absorber.

13. The device according to claim 3, wherein the resin in the second particle-containing layer contains a UV absorber.

14. The device according to claim 4, wherein the resin in the second particle-containing layer contains a UV absorber.

15. The device according to claim 2, wherein the particles in the second particle-containing layer contain a UV absorber.

16. The device according to claim 3, wherein the particles in the second particle-containing layer contain a UV absorber.

17. The device according to claim 4, wherein the particles in the second particle-containing layer contain a UV absorber.

18. The device according to claim 5, wherein the particles in the second particle-containing layer contain a UV absorber.

* * * * *